US009136962B2

(12) United States Patent
Kawano

(10) Patent No.: US 9,136,962 B2
(45) Date of Patent: Sep. 15, 2015

(54) FREQUENCY CHARACTERISTICS CONTROL DEVICE

(75) Inventor: Yasuhiro Kawano, Iwata (JP)

(73) Assignee: Yamaha Corporation, Hamamatsu-shi (JP)

( * ) Notice: Subject to any disclaimer, the term of this patent is extended or adjusted under 35 U.S.C. 154(b) by 362 days.

(21) Appl. No.: 13/161,357

(22) Filed: Jun. 15, 2011

(65) Prior Publication Data

US 2011/0317852 A1 Dec. 29, 2011

(30) Foreign Application Priority Data

Jun. 25, 2010 (JP) ................................ 2010-145066

(51) Int. Cl.

| | |
|---|---|
| ***H04B 1/00*** | (2006.01) |
| ***H03G 5/00*** | (2006.01) |
| ***H04H 60/04*** | (2008.01) |
| *H04R 3/04* | (2006.01) |

(52) U.S. Cl.

CPC . *H04H 60/04* (2013.01); *H04R 3/04* (2013.01)

(58) Field of Classification Search

CPC ...... H04H 60/04; G10L 19/008; G10L 19/20; G01H 1/0058; G01H 1/46; H04R 3/00; H04R 3/04; H03G 5/005; H03G 5/025; H03G 5/165

USPC ............. 381/98, 94.1, 61, 99, 103, 118, 119; 369/3, 4; 84/625, 660

See application file for complete search history.

(56) References Cited

U.S. PATENT DOCUMENTS

2003/0059067 A1* 3/2003 Shibata ......................... 381/119
2004/0008851 A1* 1/2004 Hagiwara ..................... 381/104
2004/0039464 A1* 2/2004 Virolainen et al. ............. 700/94
2004/0071301 A1* 4/2004 Okabayashi .................. 381/119
2004/0159218 A1* 8/2004 Aiso et al. ....................... 84/625
2005/0157830 A1* 7/2005 Ota et al. ....................... 375/377
2005/0166101 A1* 7/2005 Alexandre .................... 714/700
2005/0213779 A1* 9/2005 Coats ............................ 381/101
2005/0259828 A1* 11/2005 Van den Berghe ............. 381/23

(Continued)

FOREIGN PATENT DOCUMENTS

GB 2 430 319 A 3/2007
GB 2430319 A * 3/2007 ............. G10L 21/02

(Continued)

OTHER PUBLICATIONS

European Search Report mailed Dec. 19, 2012, for EP Application No. 11169729, five pages.

*Primary Examiner* — Xu Mei
(74) *Attorney, Agent, or Firm* — Morrison & Foerster LLP

(57) ABSTRACT

A frequency characteristics control device of a mixer mixes a first audio signal and a second audio signal inputted to the mixer. In the frequency characteristics control device, a characteristics detection section detects a first frequency characteristic of the first audio signal and a second frequency characteristic of the second audio signal. Based on the first and second frequency characteristics, a removal band detection section detects a removal band in which a level of the first audio signal is higher than a level of the second audio signal. A filtering process section performs a filtering process on the second audio signal so as to attenuate a component of the second audio signal in the removal band. A output section mixes the first audio signal inputted to the mixer and the second audio signal on which the filtering process section has performed the filtering process.

7 Claims, 7 Drawing Sheets

(56) References Cited

U.S. PATENT DOCUMENTS

| | | | | |
|---|---|---|---|---|
| 2006/0072768 | A1* | 4/2006 | Schwartz et al. | 381/94.1 |
| 2006/0098827 | A1* | 5/2006 | Paddock et al. | 381/106 |
| 2006/0222188 | A1* | 10/2006 | Asakawa | 381/94.1 |
| 2008/0080720 | A1* | 4/2008 | Jacob et al. | 381/103 |
| 2008/0199027 | A1* | 8/2008 | Kleczkowski | 381/119 |
| 2008/0281451 | A1* | 11/2008 | Aoki et al. | 700/94 |
| 2009/0028359 | A1* | 1/2009 | Terada et al. | 381/119 |
| 2009/0210239 | A1* | 8/2009 | Yoon et al. | 704/500 |
| 2009/0265164 | A1* | 10/2009 | Yoon et al. | 704/200 |
| 2009/0282967 | A1* | 11/2009 | Skillings | 84/742 |

FOREIGN PATENT DOCUMENTS

| | | | |
|---|---|---|---|
| JP | 2006-270507 | A | 10/2006 |
| JP | 4-274418 | B2 | 6/2009 |
| WO | WO-2007/015652 | A2 | 2/2007 |

* cited by examiner

FREQUENCY CHARACTERISTICS CONTROL DEVICE

BACKGROUND OF THE INVENTION

1. Technical Field of the Invention

The present invention relates to a frequency characteristics control device suitable for application to an audio apparatus such as a mixer that mixes audio signals, and more particularly to a frequency characteristics control device that can accentuate an audio signal of a solo part such as vocal relative to an audio signal of a back part such as an accompaniment instrument.

2. Description of the Related Art

A mixer that adjusts characteristics of a plurality of audio signals inputted from microphones or the like through a plurality of input channels and mixes the adjusted audio signals on a plurality of mix buses and outputs the mixed signal is known in the art (for example, see Patent Reference 1).

A technology for removing a specific audio signal already known from a mixed audio signal is also known (see Patent Reference 2). In this technology, a specific acoustic amplitude spectrum is extracted from the specific audio signal that the user desires to remove, and a mixed acoustic amplitude spectrum is extracted from the mixed audio signal produced through mixture of the specific audio signal and other audio signals. Then, the removal extent of the specific signal is set, assuming that the mixed audio signal and the specific audio signal are distributed with the same probabilities with the phase difference between the mixed audio signal and the specific audio signal being in a range of 0 to 360 degrees, and the specific acoustic amplitude spectrum is exchanged based on the setting to remove the specific acoustic amplitude spectrum from the mixed acoustic amplitude spectrum.

[Patent Reference 1] Japanese Patent Application Publication No. 2006-270507

[Patent Reference 2] Japanese Patent No. 4274418

When an audio signal of a specific channel (for example, a vocal sound or a musical instrument sound of a solo part) and audio signals of other channels (for example, musical instrument sounds of accompaniment parts) are mixed and outputted, the user may desire to perform adjustment so as to selectively emphasize the audio signal of the specific channel. In this case, the user desires only to accentuate a specific audio signal from an audio signal as opposed to the prior art which removes a specific audio signal. The prior art of Patent Reference 2 only removes an audio signal, and its process is very complicated.

Of course, in the case of the conventional mixer described in Patent Reference 1, it is possible for a skilled operator to accentuate an audio signal of a specific channel by adjusting each channel since a signal level, frequency characteristics, and the like of each of a plurality of channels are adjustable. However, if an unskilled operator performs such adjustment, there is a problem such as destruction of overall balance.

SUMMARY OF THE INVENTION

It is an object of the invention to provide a frequency characteristics control device that allows an operator to accentuate an audio signal of a specific channel through a simple process even when the operator is unskilled.

In order to achieve the above object, the invention provides a frequency characteristics control device of a mixer that mixes a first audio signal and a second audio signal inputted to the mixer, the frequency characteristics control device comprising: a characteristics detection section that detects a first frequency characteristic of the first audio signal and a second frequency characteristic of the second audio signal; a removal band detection section that detects, based on the first frequency characteristic and the second frequency characteristic, a removal band in which a level of the first audio signal is higher than a level of the second audio signal; a filtering process section that performs a filtering process on the second audio signal inputted to the mixer so as to attenuate a component of the second audio signal in the removal band; and an output section that mixes with each other the first audio signal inputted to the mixer and the second audio signal on which the filtering process section has performed the filtering process, and that outputs a mixed audio signal of the first audio signal and the second audio signal.

In a preferred form, before the first audio signal and the second audio signal are inputted to the mixer, the characteristics detection section previously performs detection of the first frequency characteristic and the second frequency characteristic, the removal band detection section previously performs detection of the removal band based on the detected first frequency characteristic and the detected second frequency characteristic, and the filtering process section previously determines a frequency characteristic of the filtering process effective to attenuate the component of the second audio signal in the removal band.

In such a case, the frequency characteristics control device further comprises: a storing section that previously stores a plurality of frequency characteristics in correspondence to a plurality of musical tone types; and a specifying section that specifies a musical tone type for a first audio signal included in a plurality of audio signals inputted to the mixer and specifies another musical tone type for a second audio signal included in the plurality of audio signals inputted to the mixer, wherein the removal band detection section selects a frequency characteristic corresponding to the musical tone type specified for the first audio signal as the first frequency characteristic from the plurality of the frequency characteristics stored by the storing section, also selects another frequency characteristic corresponding to the musical tone type specified for the second audio signal as the second frequency characteristic from the plurality of the frequency characteristics stored by the storing section, and uses the selected first frequency characteristic and the selected second frequency characteristic for detecting the removal band.

Alternatively, the frequency characteristics control device further comprises: a storing section that previously stores a plurality of removal bands in correspondence to a plurality of combinations of musical tone types; and a specifying section that specifies a musical tone type for a first audio signal included in a plurality of audio signals inputted to the mixer and specifies another musical tone type for a second audio signal included in the plurality of audio signals inputted to the mixer, wherein, based on the specified musical tone type for the first audio signal and the specified musical tone type for the second audio signal, the filtering process section selects a removal band corresponding to a combination of the specified musical tone types from the plurality of removal bands stored by the storing section, and uses the selected removal band to perform the filtering process on the second audio signal included in the plurality of audio signals inputted to the mixer.

In another preferred form, the frequency characteristics control device further comprises: an admitting section that admits a period specified by a user, wherein the characteristics detection section detects the first frequency characteristic and the second frequency characteristic in the specified period while the first audio signal and the second audio signal are continuously inputted to the mixer, wherein after the specified period, the removal band detection section detects the removal band based on the first frequency characteristic and the second frequency characteristic detected in the specified period, wherein the filtering process section performs the filtering process to attenuate the component of the second audio signal in the removal band detected after the specified period while the second audio signal is continuously inputted to the mixer, and wherein the output section outputs the mixed audio signal of the first audio signal and the second audio signal while the first audio signal and the second audio signal are continuously inputted to the mixer.

In an expedient form, the removal band detection section detects a plurality of removal bands in which a level of the first audio signal is higher than a level of the second audio signal, the filtering process section performs the filtering process composed of a limited number of notch filters, each notch filter having a frequency characteristic specified by a center frequency, a gain and a Q value, and the filtering process section allocates the limited number of the notch filters sequentially to a corresponding number of the removal bands in order of precedence where higher precedence is given to removal bands in which the first and second audio signals have greater levels and lower precedence is given to removal bands in which the first and second audio signals have smaller levels.

According to the invention, when a first audio signal and a second audio signal are mixed and outputted, it is possible to control frequency characteristics of the second audio signal so as to emphasize the first audio signal relative to the second audio signal. This process can be implemented through simple configurations of the characteristics detection section, the removal band detection section, and the filtering process section and can be performed even by an unskilled operator since the process is automatically performed. In addition, by previously storing detected frequency characteristic data or removal band data in association with a musical tone type, it is possible to accentuate a musical sound of a specific musical tone type simply by specifying the musical tone type during performance at a later time.

DETAILED DESCRIPTION OF THE INVENTION

Embodiments of the invention will now be described with reference to the drawings.

Figure 1:
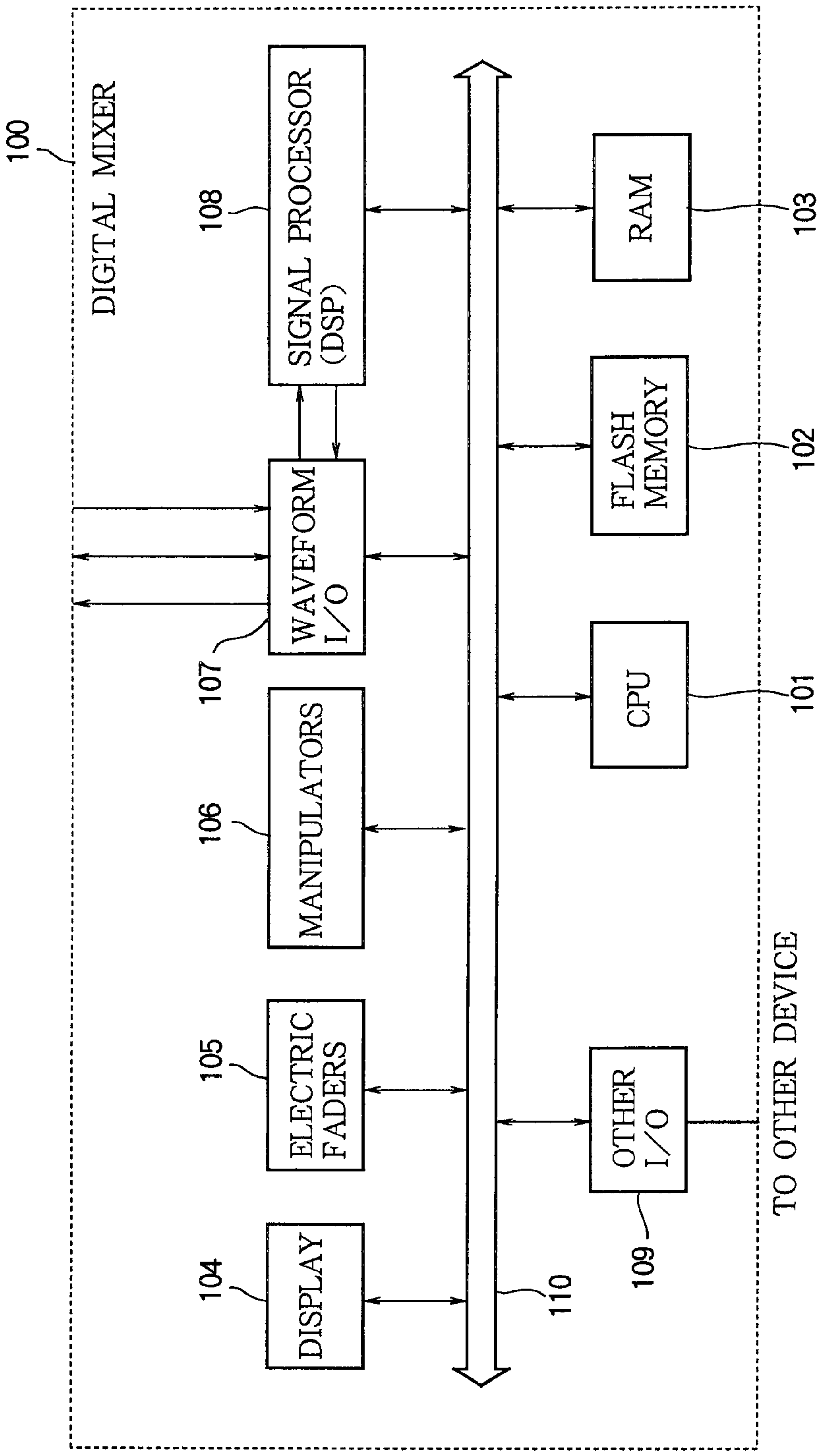
FIG. 1 is a block diagram illustrating a hardware configuration of a digital mixer according to an embodiment.

FIG. 1 is a block diagram illustrating a hardware configuration of a digital mixer according to a first embodiment of the invention. A Central Processing Unit (CPU) 101 is a processing device that controls the overall operation of the mixer. A flash memory 102 is a nonvolatile memory that stores various programs executed by the CPU 101, various data, and the like. A Random Access Memory (RAM) 103 is a volatile memory used as a work area or a load area of a program executed by the CPU 101. A display 104 is a display device provided on a control panel of the mixer for displaying a variety of information. Electric faders 105 are a kind of manipulators for level adjustment, which are provided on the manipulation panel. The manipulators 106 are various manipulators (other than electric faders) for manipulation by the user, which are provided on the manipulation panel. A waveform input/output (I/O) interface 107 is an interface for exchanging waveform signals with an external device. A signal processor (DSP) 108 executes various microprograms based on instructions from the CPU 101 to perform a mixing process, an effect imparting process, an audio volume level control process, and the like on a waveform signal received through the waveform I/O interface 107, and outputs the processed waveform signal through the waveform I/O interface 107. Another I/O interface 109 is an interface for connection to another device. A bus 110 is a set of bus lines for connection between these components and collectively refers to a control bus, a data bus, and an address bus.

Figure 2:
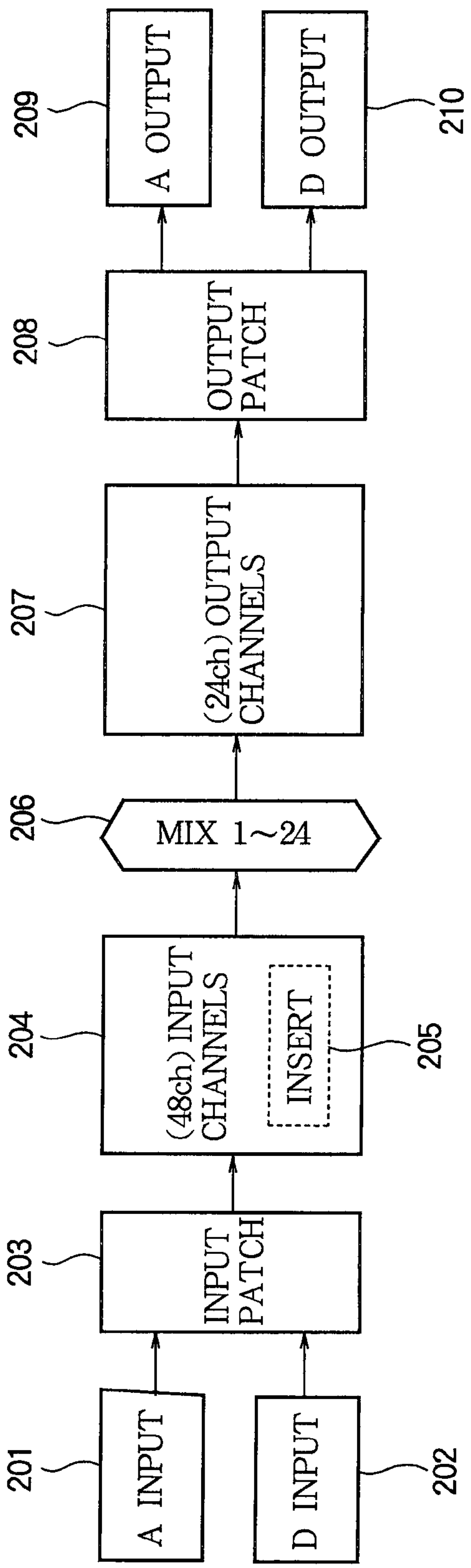
FIG. 2 is a functional block diagram of a digital mixer according to an embodiment.

FIG. 2 is a block diagram illustrating flow of an audio signal in the waveform I/O interface 107 and the DSP 108 in the mixer 100 of FIG. 1. Reference numeral "201" denotes an analog input (A input) for inputting an analog audio signal such as a microphone signal or a line signal in the waveform I/O interface 107. The analog input 201 is connected to an input channel 204 after being converted into a digital signal. Reference numeral "202" denotes a digital input for inputting a digital audio signal from an external device. An input patch 203 establishes arbitrary line connections from the inputs to forty eight input channels (48 ch) 204. The user may arbitrarily set such connections while viewing a specific screen. Signals of arbitrary ones of the input channels 204 may be outputted at arbitrary levels to each of twenty four mix buses 206. An insertion (or insert) 205 is an effect that may be inserted into an input channel. While each input channel includes signal adjustment processing functions such as a compressor and an equalizer, the insertion 205 may insert an effect process, for example, between these processing functions and subsequent electric fader(s).

Each of the mix buses 206 mixes inputs from the input channels 204. The level of a signal from each channel may be adjusted using an electric fader 105 or the like allocated to the channel. A mixed signal of each of the mix buses is outputted to a corresponding output channel 207. Outputs of the output channels 207 are inputted to an output patch 208. The output patch 208 performs desired line connection from each of the channels inputted to the output patch 208 to a desired output (analog output or digital output). The analog output 209 is an analog output of a waveform I/O interface which converts a digital audio signal outputted from the output patch 208 into an analog audio signal and outputs the analog audio signal. The digital output 210 outputs the digital audio signal to an external device without conversion.

Among an overall series of signal processing performed by the digital mixer, a series of signal processing from the input patch 203 to the output patch 208 is implemented through the DSP 108 in which a microprogram and parameters have been set by the CPU 101. The user may allocate an effect to the insertion 205 by arbitrarily selecting the effect from internal effects whose corresponding data has already been prepared in the flash memory 102. When the user issues an instruction to select and insert one internal effect into one input channel, the CPU 101 reads a microprogram and parameters of the selected internal effect from the flash memory 102 and sets the microprogram and parameters in the DSP 108. Then, the DSP 108 imparts a corresponding effect to an audio signal of the input channel based on the set microprogram and parameters to implement the insertion 205. Since resources of the DSP 108 are limited, the total number of effects that can be used as the insertion 205 is determined and a smaller number of internal effects than the total number are allocated to the insertion 205. The internal effects include not only basic effects that are previously stored upon factory shipment but also additional effects that are thereafter purchased and made available by the user. An external processing device may also perform an insertion process when the resources of the DSP 108 are not sufficient.

Figure 3:
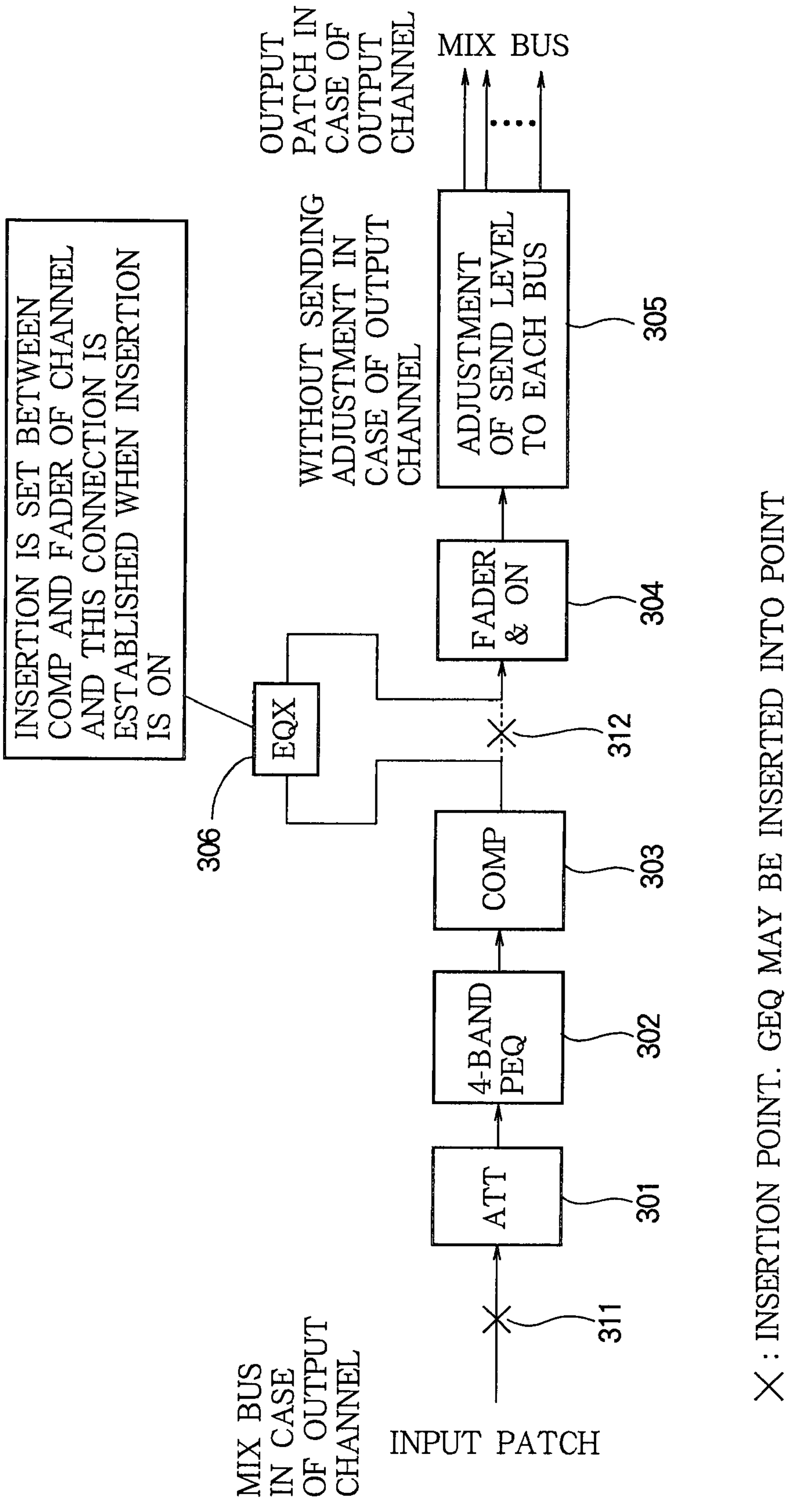
FIG. 3 is a detailed functional block diagram of each input channel and each output channel.

FIG. 3 is a block diagram illustrating an exemplary functional configuration corresponding to one of the input channels 204 and one of the output channels 207 illustrated in FIG. 2. First, a functional configuration of one input channel is described below. A digital signal is inputted from the input patch 203 to the input channel. An output signal of the input channel is outputted to the mix buses 206. The input channel includes an attenuator (ATT) 301, a 4-band parametric equalizer (PEQ) 302, a compressor (COMP) 303, a fader & on switch 304, and a send level adjuster 305.

The ATT 301 performs level control of a head part of an audio signal inputted to the input channel. The PEQ 302 performs a process for adjusting frequency characteristics of the audio signal. The COMP 303 performs an automatic gain control process. The fader & on switch 304 performs a process for adjusting the signal level of the input channel to a signal level corresponding to a set position of the fader, and turns on or off signal output of the channel. The send level adjuster 305 adjusts the send level of a signal of the input channel to each mix bus 206 when the signal of the input channel is outputted to each mix bus 206. An output signal of one input channel may be outputted to an arbitrary mix bus 206. Symbols "X" 311 and 312 denote insertion points. The user may perform setting for inserting a selected insertion effecter such as an equalizer at one of the insertion positions. For example, an EQX 306 is an equalizer that is an insertion inserted at the position 312.

While the functional configuration of an input channel has been described above, the functional configuration of an output channel is similar to that of the illustrated input channel. Each output channel includes an ATT and a digital audio signal from a mix bus 206 corresponding to the output channel is inputted to a 4-band PEQ 302. In addition, an output signal of a fader & on switch 304 of the output channel is outputted to the output patch 208. The send level adjuster 305 is unnecessary for the output channel.

Figure 4:
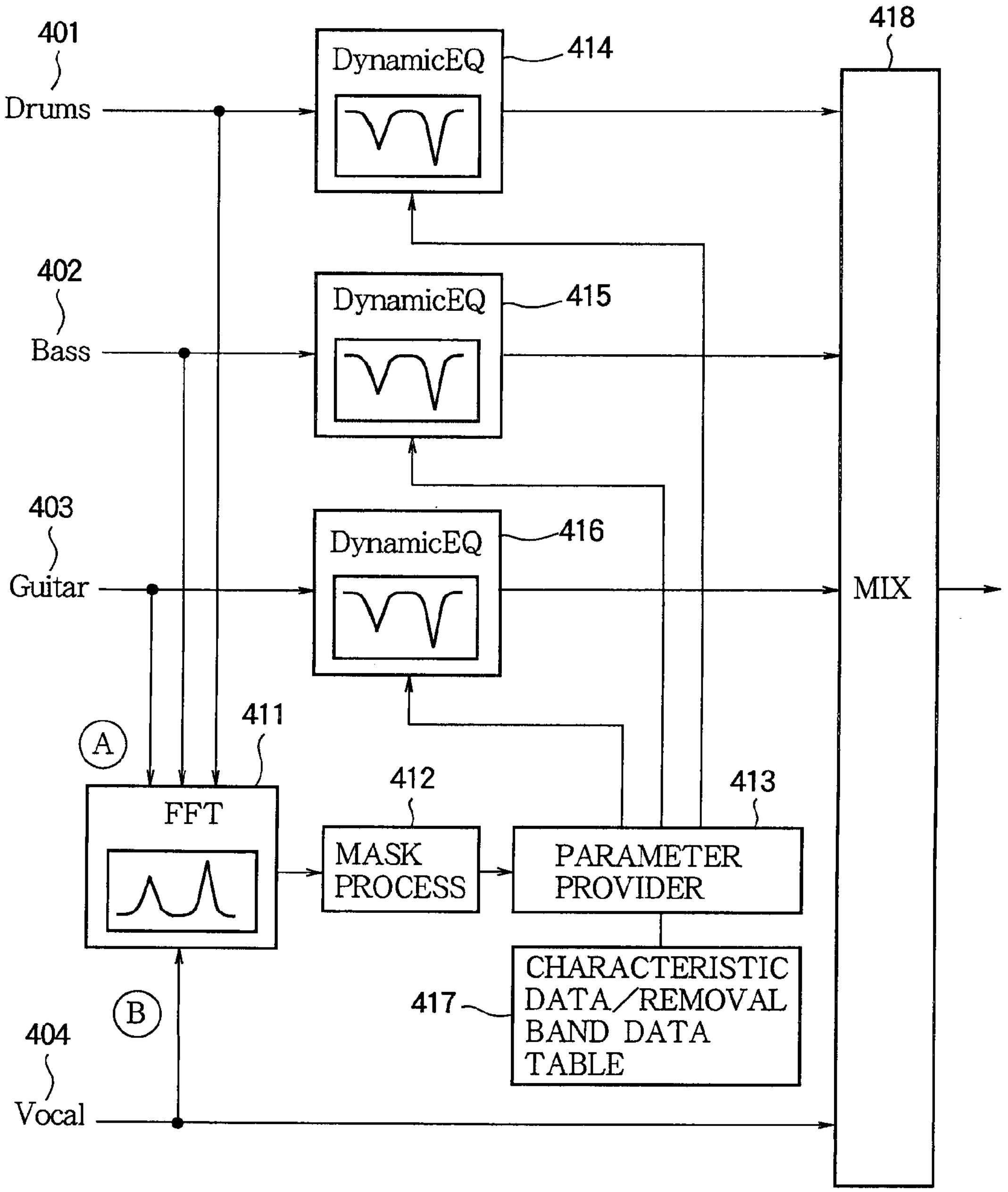
FIG. 4 is a block diagram illustrating operations of equalizers.

FIG. 4 is a block diagram illustrating an insertion 205 that performs a frequency characteristics control operation of the invention, which will be referred to as an insertion of the invention. Here, configuration blocks of four input channels are not illustrated but the four channels are instead shown as right-pointing arrows. The mix buses 206 are shown as a mix bus 418. The user can insert the insertion 205 of the invention into, for example, input channels 1 to 4 among the forty eight input channels 204. For example, let us assume that the insertion 205 of the invention is inserted into the input channels 1 to 4 and the input patch 203 is set such that audio signals of a drum 401, a bass 402, a guitar 403, and a vocal 404 are inputted respectively to the input channels 1 to 4. For the insertion 205 of the invention, the user specifies that the input channel 4 among the four input channels 1 to 4 into which the insertion 205 of the invention has been inserted is a channel of a part that the user desires to accentuate (hereinafter referred to as a specified channel). To accomplish this, first, a frequency spectrum is obtained by analyzing signals of channels of accompaniment parts and a channel of a vocal part through a Fast Fourier Transform (FFT) analyzer 411.

Figure 5:
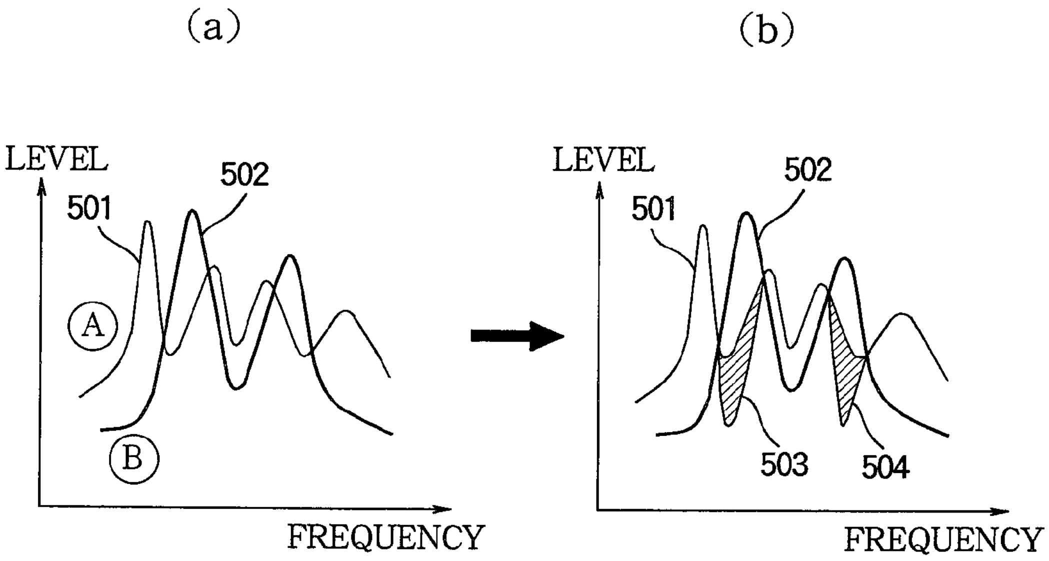
FIG. 5 illustrates manner by which frequency components of a sound in a removal band are partially cut off in order to emphasize vocal.

Section (a) of FIG. 5 illustrates exemplary frequency spectrums of a vocal sound and a guitar sound acquired by the FFT analyzer 411. A waveform 501 indicated by (A) represents a frequency spectrum of a guitar sound of channel 3 and a waveform 502 indicated by (B) represents a frequency spectrum of a vocal sound of channel 4. A mask processor 412 of FIG. 4 compares the frequency spectrums of the guitar sound and the vocal sound and detects frequency bands in which the level of the vocal sound is higher than the level of the guitar sound. For example, in the example of FIG. 5, the level of the vocal sound is higher than the level of the guitar sound in bands of shaded portions 503 and 504 as shown in section (b) of FIG. 5. These bands 503 and 504 are bands that the user desires to emphasize and stress the vocal sound. The user desires to lower the level of the guitar sound which is an accompaniment in the bands 503 and 504 since the vocal sound tends to be less noticeable than the guitar sound due to auditory masking effects. Therefore, a parameter provider 413 provides a parameter, which allows the levels of the detected frequency bands 503 and 504 to be reduced by a predetermined level, to a dynamic EQ 416 that adjusts the frequency characteristics of the channel 3 of the guitar sound. The EQ 416 lowers the levels of the bands 503 and 504 of the guitar sound according to the provided parameter. Accordingly, the components of the bands of the guitar sound, because of which it is difficult to hear the vocal sound that the user desires to accentuate due to the masking effects, are cut off by a predetermined level and, when the guitar sound and the vocal sound are mixed by the mix bus 418 and the signal mixture is then reproduced, the vocal sound is emphasized and heard clearly.

Similarly, frequency bands in which the level of the vocal sound is higher than the levels of the drum sound and the bass sound which are the other accompaniment sounds are detected and parameters, which allow the levels of the accompaniment sounds to be reduced by a predetermined level in the detected frequency bands, are provided to EQs 414 and 415. The drum, bass, and guitar sounds which are accompaniment sounds are outputted to the mix buses 418 (206 in FIG. 2) after the components of the accompaniment sounds in the detected frequency bands are cut off through the EQs 414 to 416. The vocal sound is outputted to the mix buses 418 without such frequency characteristics control (after common input channel processing is performed). The drum, bass, and guitar audio signals whose frequency characteristics have been controlled and the vocal sound are mixed in a mix bus 418, and the characteristics of the mixed sound are readjusted in an output channel 207 corresponding to the mix bus and the resulting audio signal is outputted through the analog output 209 or the digital output 210 to which line connection has been established by the output patch 208. The output audio signal is power-amplified by an amplifier and the amplified audio signal is reproduced through a speaker. Such frequency characteristics control of the invention allows the vocal sound to be clearly emphasized and heard in the mixture of the vocal, drum, bass, and guitar sounds outputted through the speaker.

The FFT analyzer 411, the mask processor 412, and the parameter provider 413 may be implemented as processes performed by the DSP 108. Alternatively, part of the processes of the FFT analyzer 411, the mask processor 412, and the parameter provider 413 may be assigned to the CPU 101 such that the FFT analyzer 411, the mask processor 412, and the parameter provider 413 are implemented as cooperative processes of the DSP 108 and the CPU 101. In addition, the insertion 205 of the invention controls the frequency characteristics of audio signals of channels other than the specified channel from among the four channels, in which the insertion 205 has been inserted, using the EQs 414 to 416. It is possible to accentuate the vocal sound of the specified channel by appropriately controlling the frequency characteristics of the three EQs 414 to 416.

Here, it is also assumed that the user specifies channels of the accompaniment sounds to be subjected to frequency characteristics control using a relationship between the accompaniment sounds and the vocal sound that the user desires to accentuate since frequency characteristics control described above need not be performed on all accompaniment sounds.

The above operation may be divided into several schemes according to timings when analysis of the FFT analyzer 411 or the mask processor 412 is performed.

In the first scheme, analysis is performed and characteristic data of the analysis result is acquired in advance before on-stage performance. First, when a performance is played at rehearsal or on-stage, audio signals inputted to input channels of the mixer are directly recorded on tracks of a multitrack recorder. After the audio signals are recorded, the audio signals of the tracks are reproduced. Then, frequency characteristics of the channels are detected through the FFT analyzer 411 as described above and the detected frequency characteristics are stored as frequency characteristic data in a table 417. Here, the channels (or tracks) that are recorded and the channels whose frequency characteristics are detected may be four channels (or tracks) in which the insertion 205 of the invention has been inserted. The user specifies a channel, which the user desires to accentuate among the four channels, which will herein be referred to as a "solo channel" although it is substantially the same as the specified channel described above, and the other channels are set as channels (referred to as "back channels") on which frequency characteristics control will be performed as described above. In order to accentuate the solo sound, the characteristics of the solo channel and the characteristics of each back channel are compared with each other as described above with reference to FIG. 5. Then, bands in which the level of the solo channel is higher than the level of each back channel are detected and the detected (obtained) bands are stored as removal band data of each back channel in the table 417. Upon on-stage performance, the parameter provider 413 reads removal band data from the table 417 and provides the read removal band data to the EQs of the back channels (the EQs 414 to 416 in FIG. 4). In addition, the user may specify, for each track, a period in which a recorded signal of the track is to be analyzed and frequency characteristics of the specified period may then be detected.

As described above, the frequency characteristics control device of a mixer 100 mixes a first audio signal 404 and a second audio signal 403 inputted to the mixer 100. In the frequency characteristics control device, a characteristics detection section (411) detects a first frequency characteristic (B) of the first audio signal 404 and a second frequency characteristic (A) of the second audio signal 403. A removal band detection section (412 and 413) detects, based on the first frequency characteristic (B) and the second frequency characteristic (A), a removal band in which a level of the first audio signal 404 is higher than a level of the second audio signal 403. A filtering process section (413 and 416) performs a filtering process on the second audio signal 403 inputted to the mixer 100 so as to attenuate a component of the second audio signal 403 in the removal band. An output section (418) mixes with each other the first audio signal 404 inputted to the mixer 100 and the second audio signal 403 on which the filtering process section (413 and 416) has performed the filtering process, and outputs a mixed audio signal of the first audio signal 404 and the second audio signal 403.

Before the first audio signal 404 and the second audio signal 403 are inputted to the mixer 100, the characteristics detection section (411) previously performs detection of the first frequency characteristic (B) and the second frequency characteristic (A), the removal band detection section (412 and 413) previously performs detection of the removal band based on the detected first frequency characteristic (B) and the detected second frequency characteristic (A), and the filtering process section (413 and 416) previously determines a frequency characteristic of the filtering process (parameters) effective to attenuate the component of the second audio signal 403 in the removal band.

In the second scheme, a period for analysis is specified to acquire characteristic data during rehearsal or (early stage of) on-stage performance. First, during rehearsal or on-stage performance, for example, an operator who is manipulating the mixer instructs the mixer to start analysis and to stop analysis for each input channel while monitoring performance. According to this instruction, frequency characteristics of an input signal of the channel are detected through the FFT analyzer 411 in the specified period from a time when analysis start is instructed to a time when analysis stop is instructed, and frequency characteristic data is acquired and stored in the table 417. When a plurality of analysis periods has been specified for a specific channel during a single performance, analysis results of the plurality of analysis periods may be combined (for example, averaged) and used, and analysis results acquired through a plurality of performances may also be combined (for example, averaged) and used. A procedure after frequency characteristic data of each channel is acquired is similar to that of the first scheme. Here, the analysis results are time-averaged. That is, each frequency characteristic value (each frequency characteristic data) is weighted by a weight corresponding to (proportional to) the length of time during which the frequency characteristics have been detected and then the weighted frequency characteristic values are combined to acquire a piece of frequency characteristic data.

In the first and second schemes, a musical tone type such as vocal, piano, or electric guitar may be set for each track and frequency characteristic data detected in each track may then be stored in the table 417 in association with the musical tone type set for the track rather than in association with the track (i.e., only the frequency characteristic data may be stored in association with the musical tone type). In the case where the same musical tone type is set in a plurality of tracks, one piece of frequency characteristic data acquired by combining analysis results of the plurality of tracks may be stored. As a result, standard frequency characteristics are prepared for each musical tone type in the table 417. Accordingly, a "musical tone type" may be specified for each of one or more arbitrary channels among a plurality of channels in which the insertion 205 of the invention has been inserted, instead of detecting frequency characteristics of an audio signal of the channel as in the first or second scheme, and frequency characteristic data of the specified musical tone type may be read from the table 417 and the read frequency characteristic data may then be used as frequency characteristic data of the channel. Thereafter, if the musical tone type of the solo channel and the musical tone type of each back channel are specified, it is possible to obtain removal band data of each back channel as described above even when channel allocations have been changed.

As described above, in the frequency characteristics control device of the invention, a storing section (417) previously stores a plurality of frequency characteristics in correspondence to a plurality of musical tone types, and a specifying section (106) specifies a musical tone type for a first audio signal 404 included in a plurality of audio signals 401-404 inputted to the mixer 100 and specifies another musical tone type for a second audio signal 403 included in the plurality of audio signals 401-404 inputted to the mixer 100. The removal band detection section (412 and 413) selects a frequency characteristic corresponding to the musical tone type specified for the first audio signal 404 as the first frequency characteristic (B) from the plurality of the frequency characteristics stored by the storing section 417, also selects another frequency characteristic corresponding to the musical tone type specified for the second audio signal 403 as the second frequency characteristic (A) from the plurality of the frequency characteristics stored by the storing section (413), and uses the selected first frequency characteristic (B) and the selected second frequency characteristic (A) for detecting the removal band.

Further, band removal data that may be obtained in this manner may be stored in the table 417 in association with a combination of the musical tone type set for the solo channel and the musical tone type set for each back channel. Accordingly, a musical tone type may be set for each channel in which an insertion has been inserted and band removal data may be read from the table 417 according to a combination of the musical tone type set for the solo channel and the musical tone type set for each back channel and the read band removal data may then be set in an equalizer of the back channel. That is, it is possible to use frequency characteristic data or band removal data stored in the table 417, instead of analyzing frequency characteristics of audio signals of channels in which an insertion has been inserted, and it is possible to omit a procedure for creating such data upon rehearsal or on-stage performance.

As described above, in the frequency characteristics control device according to the invention, a storing section (417) previously stores a plurality of removal bands in correspondence to a plurality of combinations of musical tone types, and a specifying section (106) specifies a musical tone type for a first audio signal 404 included in a plurality of audio signals 401-404 inputted to the mixer 100 and specifies another musical tone type for a second audio signal 403 included in the plurality of audio signals 401-404 inputted to the mixer 100. Based on the specified musical tone type for the first audio signal 404 and the specified musical tone type for the second audio signal 403, the filtering process section (413 and 416) selects a removal band corresponding to a combination of the specified musical tone types from the plurality of removal bands stored by the storing section (417), and uses the selected removal band to perform the filtering process on the second audio signal 403 included in the plurality of audio signals 401-404 inputted to the mixer 100.

Although the user creates frequency characteristic data by analyzing signals of channels in the first and second schemes, a manufacturer or seller may store the provided frequency characteristic data in the table 417 in association with each musical tone type. In this case, frequency analysis of audio signals is performed by the manufacturer or seller and is not performed by the user.

In addition, the table 417 may be set in an arbitrary storage region that is accessible by the DSP 108. The frequency characteristic data or removal band data stored in the table 417 may be saved in the flash memory 102 and may be reloaded to the table 417 when used.

In the third scheme, during rehearsal or on-stage performance, sound of each channel is analyzed to acquire characteristic data and, in addition, a parameter is supplied to the EQ of each back channel. First, the operator previously specifies one solo channel and one or more back channels. When a performance is initiated, the operator instructs the mixer to start analysis and to stop analysis for each input channel while monitoring performance. According to this instruction, frequency characteristics of an input signal of the channel are detected through the FFT analyzer 411 until analysis stop is instructed after analysis start is instructed, if the level of the input signal is higher than a predetermined level, and frequency characteristic data is acquired and stored in the table 417 at intervals of a predetermined period. When a plurality of analysis periods has been specified for a specific channel during a single performance, analysis results of the plurality of analysis periods may be combined (for example, averaged) and used. When frequency characteristic data is acquired for each channel at intervals of the predetermined period, the mask processor 412 compares, for each back channel, frequency characteristic data of the back channel and frequency characteristic data of the solo channel and obtains a band in which the level of the solo channel is higher than the level of the back channel. For each back channel, the parameter provider 413 provides a parameter, which allows the level of the obtained band to be reduced by a predetermined level, to the EQ of the back channel. In this manner, a series of processes, from detection of frequency characteristics of the solo and back channels to cutoff of band components of the back channel by the EQ, is performed during performance of one piece of music.

As described above, in the frequency characteristics control device according to the invention, an admitting section 106 admits a period specified by a user. The characteristics detection section (411) detects the first frequency characteristic (B) and the second frequency characteristic (A) in the specified period while the first audio signal 404 and the second audio signal 403 are continuously inputted to the mixer 100. After the specified period, the removal band detection section (412 and 413) detects the removal band based on the first frequency characteristic (B) and the second frequency characteristic (A) detected in the specified period. The filtering process section (413 and 416) performs the filtering process to attenuate the component of the second audio signal 403 in the removal band detected after the specified period while the second audio signal 403 is continuously inputted to the mixer 100, and the output section (418) outputs the mixed audio signal of the first audio signal 404 and the second audio signal 403 while the first audio signal 404 and the second audio signal 403 are continuously inputted to the mixer 100.

The first to third schemes may be combined appropriately. For example, frequency characteristic data may be obtained according to one of the first to third provision schemes, removal band data may be acquired based on the frequency characteristic data and the EQs of the back channels may then be operated based on the removal band data. Specifically, for example, frequency characteristic data of the drum, bass, and guitar that have been previously stored in the table 417 is used for the drum, bass, and the guitar parts of the input channels 1 to 3 according to the first or second scheme and frequency characteristic data obtained by analyzing musical sound signals during performance is used for the vocal part of the input channel 4 according to the third scheme. In addition, since it is not possible in the third scheme that frequency characteristic data has been prepared at the time when a performance starts, frequency characteristic data of the vocal part stored in the table 417 may be used at that time according to the first or second scheme, similar to the other parts. Thereafter, each time an analysis result of vocal is obtained as performance proceeds, frequency characteristic data that is being used and the obtained analysis result are combined to gradually bring the frequency characteristic data of vocal in the table 417 closer to that of frequency characteristics of actual vocal.

Removal band data stored in the table 417 according to the first and second schemes may be used or removal band data generated in real time according to the third scheme may be used during on-stage performance and, when frequency characteristics of each back channel are controlled through the EQ, the frequency characteristics may be controlled using the same parameter during performance of one piece of music. For example, frequency characteristics may be controlled only in the corresponding period when the user desires to accentuate sound of the solo channel only in the period. In the latter case, the frequency characteristics of the EQ are gradually changed.

Figure 6:
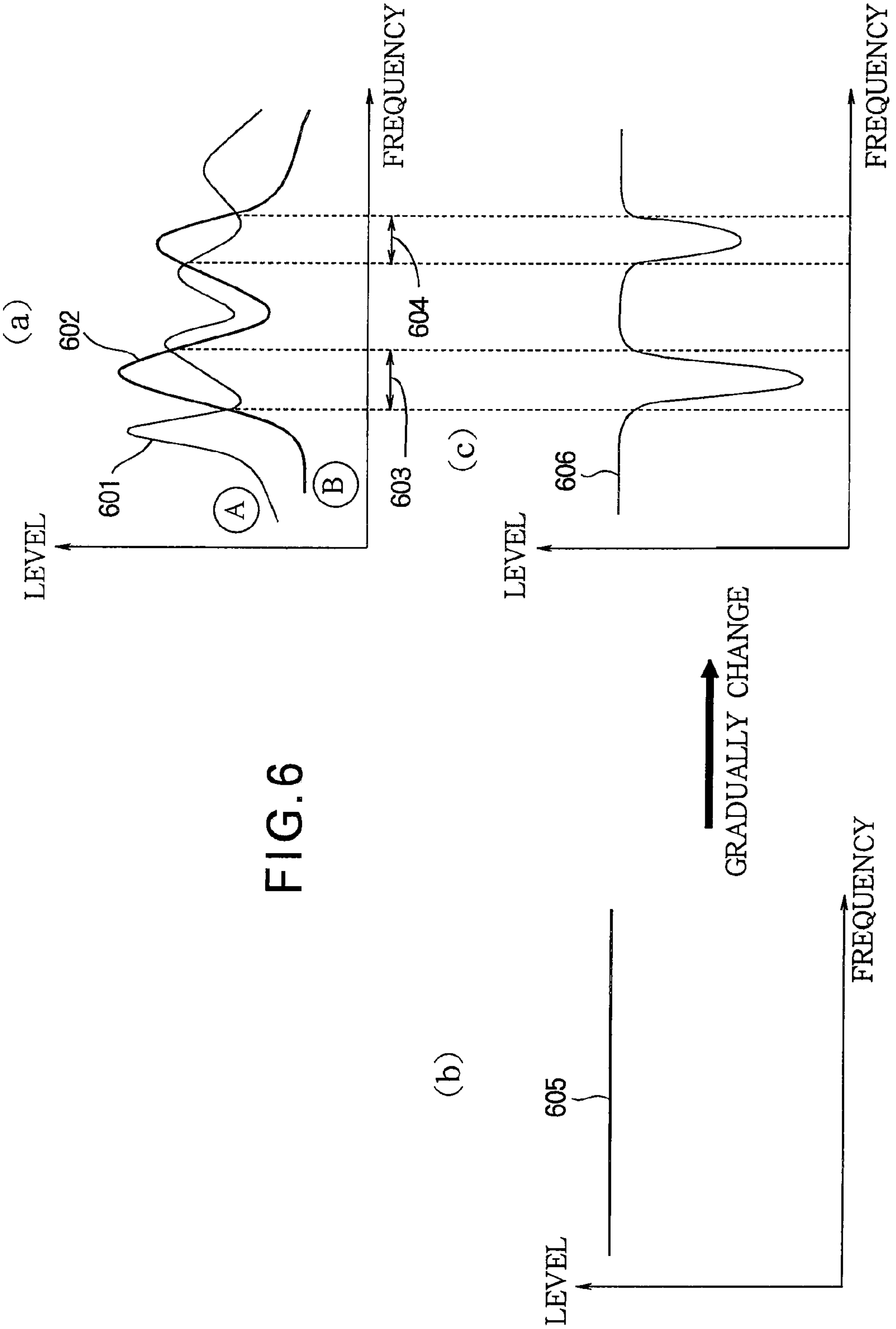
FIG. 6 illustrates how frequency characteristics of an equalizer are gradually changed.

FIG. 6 illustrates an example of the third scheme in which frequency characteristics of the EQs (for example, the EQs 414 to 416 of FIG. 4) are gradually changed. Section (a) of FIG. 6 illustrates an exemplary frequency spectrum 602 of sound of a solo channel and an exemplary frequency spectrum 601 of sound of a back channel. Bands in which the level of the solo channel is higher than the level of the back channel as described above with reference to FIG. 5 are ranges denoted by "603" and "604". Sections (b) and (c) of FIG. 6 illustrate transition of frequency characteristics control of the back channel. In the third scheme in which analysis is performed during performance, when performance of a piece of music is initiated, frequency characteristics of each input channel (i.e., each part) have not been detected and frequency characteristic data of each input channel has flat characteristics as initial characteristics and therefore frequency characteristics of an audio signal of the back channel are not changed and the EQ that performs frequency characteristics control of the back channel has flat characteristics as shown in section (b) of FIG. 6. Thereafter, the frequency characteristics of each input channel (i.e., each part) are detected and frequency characteristic data of each part gradually gets closer to the desired frequency characteristics of an audio signal of the part from flat characteristics. Accordingly, the characteristics of the EQ gradually changes to frequency characteristics based on the frequency characteristics of the solo and back channels (gradually changes to characteristics lowering the levels of the bands 603 and 604 in this example) as shown in section (c) of FIG. 6.

Although, in the above embodiment, the level of the back channel is attenuated in the removal bands (in the bands 503 and 504 in FIGS. 5 and 603 and 604 in FIG. 6) in which the level of the solo channel is higher than the level of the back channel based on the frequency characteristics of the solo channel and the frequency characteristics of the back channel, more precise frequency characteristics control may also be performed using Fourier transform and inverse Fourier transform.

Figure 7:
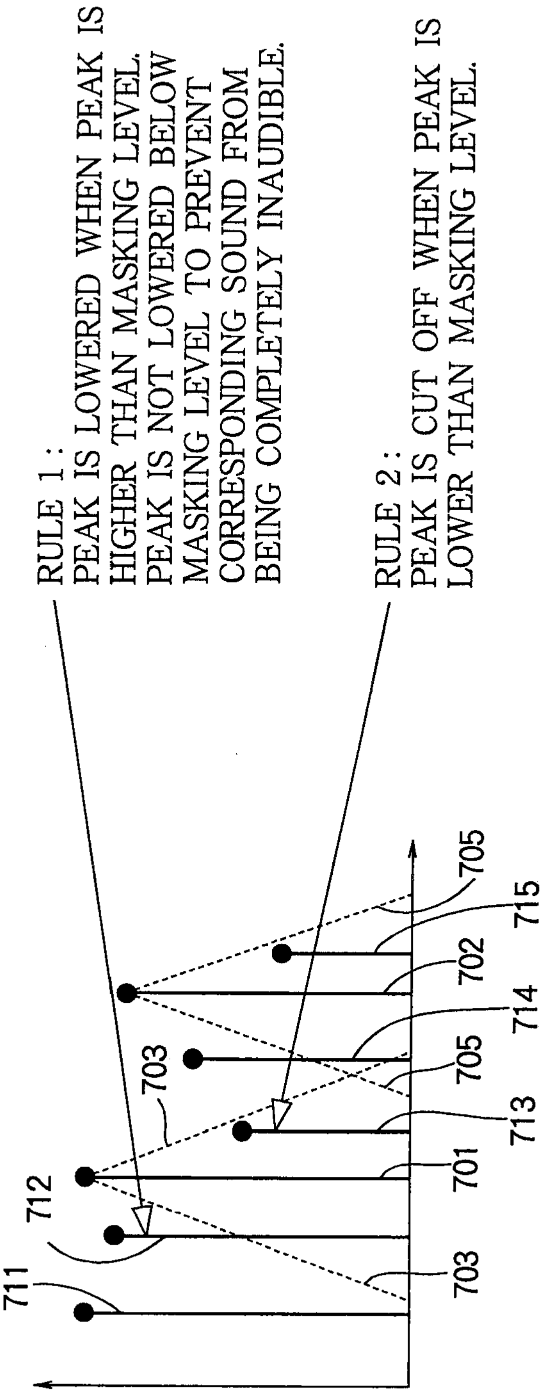
FIG. 7 illustrates exemplary rules of attenuation.

FIG. 7 illustrates exemplary high-precision frequency characteristics control. Here, frequency components of each input channel in the frequency domain obtained by performing Fourier transform on an audio signal of each input channel (i.e., each part) in the time domain are compared with each other and one or more of the frequency components of the back channel are attenuated so as to accentuate the frequency components of the solo channel according to a predetermined rule. In FIG. 7, the horizontal axis represents frequency and the vertical axis represents level. Reference numerals 701 and 702 denote peaks of sound of the solo channel. A dotted line 703 represents a masking level for the peak 701 and a dotted line 705 represents a masking level for the peak 702. The masking level 703 represents a range in which other frequency components having peaks adjacent to the peak 701 are masked due to presence of a frequency component having the peak 701. That is, since a frequency component having the peak 701 is present, other frequency components having the peak adjacent to the peak 701 are eliminated due to the auditory masking effect if the levels of the peaks of the other frequency components are equal to or lower than the masking level.

The rule 1 is that, when the peak (for example, the peak 712) of the back channel is higher than the masking level 703 of the peak 701 of the solo channel, the level of the peak of the back channel and levels adjacent to the peak of the back channel are lowered to the masking level 703. Since the peak 712 exceeds the masking level 703, the frequency component of the back channel having the peak 712 is not eliminated by the masking effect caused by presence of the peak 701 of the frequency component of the solo channel. That is, the frequency component of the back channel having the peak 712 disturbs the frequency component of the solo channel or even worse makes it difficult to hear the frequency component of the solo channel. Therefore, according to rule 1, the frequency component of the solo channel is accentuated by lowering the level of the peak 712 of the back channel to the masking level 703. Here, the frequency component of the back channel is not lowered below the masking level to prevent the frequency component of the back channel from being completely inaudible.

The rule 2 is that, when the peak (for example, the peak 713) of the back channel is lower than the masking level 703 of the peak 701 of the solo channel, the level of the frequency component of the back channel is lowered to cut the level of the peak 713 off. Since frequency components near the peak 713 of the back channel are lower than the masking level 703, the frequency components near the peak 713 are substantially eliminated by the masking effect due to the frequency component of the solo channel having the peak 701. Therefore, according to rule 2, the frequency component of the frequency band of the back channel is cut off. A plurality of frequency components of the back channel in the frequency domain adjusted according to this rule is converted into an audio signal in the time domain through inverse Fourier transform. When the audio signal of the back channel obtained in this manner is mixed with the audio signal of the solo channel and the audio signal mixture is reproduced through a speaker or earphone, vocal of the output channel is more prominently heard.

The EQs (for example, the EQs 414 to 416 of FIG. 4) that perform frequency characteristics control of the back channel are specifically composed of a limited number of notch filters. The frequency characteristics of each notch filter are specified by parameters such as a center frequency, a gain, and a Q value and the parameter provider 413 determines these parameters based on removal band data. Here, it is assumed that the limited number of notch filters are sequentially allocated to bands, in which the levels of first and second audio signals are great, among the detected removal bands.

As described above, in the frequency characteristics control device according to the invention, the removal band detection section (412 and 413) detects a plurality of removal bands 503 and 504 in which a level of the first audio signal 502 is higher than a level of the second audio signal 501. The filtering process section (416) performs the filtering process composed of a limited number of notch filters, each notch filter having a frequency characteristic specified by a center frequency, a gain and a Q value. The filtering process section (413 and 416) allocates the limited number of the notch filters sequentially to a corresponding number of the removal bands in order of precedence where higher precedence is given to removal bands 503 in which the first and second audio signals 502 and 501 have greater levels and lower precedence is given to removal bands 504 in which the first and second audio signals 502 and 501 have smaller levels.

In addition, although the number of channels of the insertion 205 of the invention has been described as four, the number of channels of the insertion 205 is arbitrary. In addition, the size of the insertion 205 (the number of channels in this example) may not be fixed but may be allowed to be set by the user.

Although frequency characteristic data is stored in the table 417 in association with each musical tone type, a musical sound ID (identification code) which can specify a more detailed aspect such as a performer, a musical instrument, or a melody than the musical tone type may be prepared and frequency characteristic data may be stored in association with the musical sound ID. In this case, frequency characteristic data which is different for each individual is provided from the table 417 even with the same vocal type and frequency characteristic data which is different for each musical instrument is provided from the table 417 even with the same instrument type. In addition, frequency characteristic data which is different for each musical instrument may be provided even with the same performer or frequency characteristic data which is different for each performer or melody may be provided even with the same musical instrument.

As a compromise solution, frequency characteristic data stored in the table 417 in association with a musical sound ID and frequency characteristic data stored in association with a musical tone type may be present together. For example, frequency characteristic data of vocal may be stored in association with a musical sound ID (for each singer) and frequency characteristic data of each part other than vocal may be stored in association with a musical tone type.

Although band removal data is stored in the table 417 in association with a combination of the musical tone type of the solo channel and the musical tone type of each back channel in the above embodiment, one or both of the musical tone type of the solo channel and the musical tone type of the back channel may be replaced with a musical sound ID in the same manner.

Although the above embodiment has been described with reference to an example in which an insertion has been inserted in four input channels of the mixer and one of the four channels is used as a solo channel and the other three channels are used as back channels, only the back channels may be implemented by inserting an insertion in the back channels while instructions associated with the solo channel are performed using parameters allocated to the insertion. In addition, although the above embodiment has been described with reference to an example in which the processes of the invention are implemented through insertion, the processes may also be implemented using parametric EQs functions which are the original or default functions of the mixer rather than using the insertion.

What is claimed is:

1. A frequency characteristics control device of a mixer that mixes a first audio signal and a second audio signal inputted to the mixer, the frequency characteristics control device comprising:

a characteristics detection section that detects a first frequency characteristic of the first audio signal and a second frequency characteristic of the second audio signal;

a removal band detection section that detects, based on the first frequency characteristic and the second frequency characteristic, a removal band in which a level of the first audio signal is higher than a level of the second audio signal;

a filtering process section that performs a filtering process on the second audio signal inputted to the mixer so as to attenuate a component of the second audio signal in the removal band while any frequency band of the first audio signal is not attenuated relative to the second audio signal by the filtering process section;

an output section that mixes with each other the first audio signal inputted to the mixer and the second audio signal on which the filtering process section has performed the filtering process, and that outputs a mixed audio signal of the first audio signal and the second audio signal; and a specifying section that allows a user to specify a channel among a plurality of channels of said mixer such that the first audio signal is a signal of said specified channel and the second audio signal is a signal of another channel of the mixer, so as to emphasize the first audio signal relative to the second audio signal.

2. The frequency characteristics control device according to claim 1, wherein before the first audio signal and the second audio signal are inputted to the mixer, the characteristics detection section previously performs detection of the first frequency characteristic and the second frequency characteristic, the removal band detection section previously performs detection of the removal band based on the detected first frequency characteristic and the detected second frequency characteristic, and the filtering process section previously determines a frequency characteristic of the filtering process effective to attenuate the component of the second audio signal in the removal band.

3. The frequency characteristics control device according to claim 2, further comprising:

a storing section that previously stores a plurality of frequency characteristics in correspondence to a plurality of musical tone types, wherein the specifying section specifies a musical tone type for a first audio signal included in a plurality of audio signals inputted to the mixer and specifies another musical tone type for a second audio signal included in the plurality of audio signals inputted to the mixer, and wherein the removal band detection section selects a frequency characteristic corresponding to the musical tone type specified for the first audio signal as the first frequency characteristic from the plurality of the frequency characteristics stored by the storing section, also selects another frequency characteristic corresponding to the musical tone type specified for the second audio signal as the second frequency characteristic from the plurality of the frequency characteristics stored by the storing section, and uses the selected first frequency characteristic and the selected second frequency characteristic for detecting the removal band.

4. The frequency characteristics control device according to claim 2, further comprising:

a storing section that previously stores a plurality of removal bands in correspondence to a plurality of combinations of musical tone types, wherein the specifying section specifies a musical tone type for a first audio signal included in a plurality of audio signals inputted to the mixer and specifies another musical tone type for a second audio signal included in the plurality of audio signals inputted to the mixer, and wherein, based on the specified musical tone type for the first audio signal and the specified musical tone type for the second audio signal, the filtering process section selects a removal band corresponding to a combination of the specified musical tone types from the plurality of removal bands stored by the storing section, and uses the selected removal band to perform the filtering process on the second audio signal included in the plurality of audio signals inputted to the mixer.

5. The frequency characteristics control device according to claim 1, further comprising:

an admitting section that admits a period specified by a user, wherein the characteristics detection section detects the first frequency characteristic and the second frequency characteristic in the specified period while the first audio signal and the second audio signal are continuously inputted to the mixer, wherein after the specified period, the removal band detection section detects the removal band based on the first frequency characteristic and the second frequency characteristic detected in the specified period, wherein the filtering process section performs the filtering process to attenuate the component of the second audio signal in the removal band detected after the specified period while the second audio signal is continuously inputted to the mixer, and wherein the output section outputs the mixed audio signal of the first audio signal and the second audio signal while the first audio signal and the second audio signal are continuously inputted to the mixer.

6. The frequency characteristics control device according to claim 1, wherein the removal band detection section detects a plurality of removal bands in which a level of the first audio signal is higher than a level of the second audio signal, wherein the filtering process section performs the filtering process composed of a limited number of notch filters, each notch filter having a frequency characteristic specified by a center frequency, a gain and a Q value, and wherein the filtering process section allocates the limited number of the notch filters sequentially to a corresponding number of the removal bands in order of precedence where higher precedence is given to removal bands in which the first and second audio signals have greater levels and lower precedence is given to removal bands in which the first and second audio signals have smaller levels.

7. The frequency characteristics control device according to claim 1, wherein:

the specifying section allows a user to specify a channel among a plurality of channels of said mixer such that a plurality of second audio signals are received by the mixer through other channels than the specified channel, and the removal band detection section detects the removal band for each second audio signal based on the first frequency characteristic of the first audio signal and solely based on the second frequency characteristic of each second audio signal.

* * * * *